United States Patent

Baumann et al.

[11] Patent Number: 6,087,066
[45] Date of Patent: Jul. 11, 2000

[54] POLYVINYL ACETALS HAVING IMIDO GROUPS AND USE THEREOF IN PHOTOSENSITIVE COMPOSITIONS

[75] Inventors: Harald Baumann, Osterode; Celin Savariar-Hauck, Badenhausen; Hans-Joachim Timpe, Osterode, all of Germany

[73] Assignee: Kodak Polychrome Graphics LLC, Norwalk, Conn.

[21] Appl. No.: 09/418,284

[22] Filed: Oct. 14, 1999

[30] Foreign Application Priority Data

Oct. 15, 1998 [DE] Germany .................. 198 47 616

[51] Int. Cl.$^7$ .................. G03C 1/73; G03C 1/72; G03C 1/74; C08G 4/00; C08J 3/28

[52] U.S. Cl. .................. 430/270.1; 430/909; 430/926; 430/283.1; 430/302; 525/58; 525/61; 522/26; 522/27; 522/53; 522/166; 427/510; 427/514

[58] Field of Search .................. 525/58, 61, 56, 525/59, 60; 522/26, 27, 53, 154, 166; 427/510, 514; 430/270.1, 287.1, 909, 912, 926, 302, 283.1, 906, 905

[56] References Cited

U.S. PATENT DOCUMENTS

| | | | |
|---|---|---|---|
| 2,179,051 | 11/1939 | Morrison et al. | ............. 525/61 |
| 3,732,106 | 5/1973 | Steppan et al. | ............. 430/283.1 |
| 4,102,686 | 7/1978 | Weinberger et al. | ............. 96/91 |

(List continued on next page.)

FOREIGN PATENT DOCUMENTS

| | | |
|---|---|---|
| 048876 | 4/1982 | European Pat. Off. . |
| 071881 | 2/1983 | European Pat. Off. . |
| 104863 | 4/1984 | European Pat. Off. . |
| 135026 | 3/1985 | European Pat. Off. . |
| 152819 | 8/1985 | European Pat. Off. . |
| 0632328 | 6/1986 | European Pat. Off. . |
| 186156 | 7/1986 | European Pat. Off. . |
| 0021019 | 1/1987 | European Pat. Off. . |
| 208145 | 1/1987 | European Pat. Off. . |

(List continued on next page.)

OTHER PUBLICATIONS

Baumann et al., "Chemical Aspects of Offset Printing", *J. prakt. Chem./Chemiker–Zeitung* (Journal for Chemists) 336 (1994), pp. 336–377.

*Primary Examiner*—Janet Baxter
*Assistant Examiner*—Sin J. Lee
*Attorney, Agent, or Firm*—Baker Botts L.L.P.

[57] ABSTRACT

This invention relates to polyvinyl acetals containing the units A, B, C and D, wherein
A is present in an amount of 0.5 to 20 wt.-% and is of the formula $$-CH_2-CH- \quad (A)$$
$$\qquad\quad |$$
$$\qquad\quad OCOCH_3$$

B is present in an amount of 15 to 35 wt.-% and is of the formula $$-CH_2-CH- \quad (B)$$
$$\qquad\quad |$$
$$\qquad\quad OH$$

C is present in an amount of 10 to 50 wt.-% and is of the formula (C)

[structure with 1,3-dioxane ring bearing $R^1$ substituent and $CH_2$ linkage]

wherein $R^1$ is an alkyl group with up to 4 carbons, which is optionally substituted by an acid group, or a phenyl group, to which an acid group is attached, wherein the phenyl group optionally comprises 1 to 2 further substituents selected from halos, amino, methoxy, ethoxy, methyl and ethyl groups, or is a group $X-NR^6-CO-Y-COOH$, wherein X is an aliphatic, aromatic or araliphatic spacer group, $R^6$ is hydrogen or an aliphatic, aromatic or araliphatic moiety and Y is a saturated or unsaturated chain- or ring-shaped spacer group, and this unit C may be contained several times with various moieties $R^1$ independent of one another, and D is present in an amount of 25 to 70 wt.-% and is of the formula (D)

[structure with 1,3-dioxane ring, $[R^2-C-R^3]_n$ group, and maleimide-like N-containing ring bearing $R^4$, $R^5$]

wherein
n is an integer from 1 to 3 and
$R^2$ and $R^3$ are a hydrogen or a methyl group, and
$R^4$ and $R^5$ independent of one another are alkyl groups having no more than 4 carbons or $R^4$ and $R^5$, together with the two carbons they are attached to, represent a 5- or 6-membered carbocyclic ring.

In addition, photosensitive compositions containing these polyvinyl acetals are described.

16 Claims, No Drawings

U.S. PATENT DOCUMENTS

| | | | |
|---|---|---|---|
| 4,123,276 | 10/1978 | Kita et al. | 430/176 |
| 4,304,832 | 12/1981 | Ohta et al. | 430/175 |
| 4,387,151 | 6/1983 | Bosse et al. | 430/175 |
| 4,731,316 | 3/1988 | Tomiyasu et al. | 430/157 |
| 4,741,985 | 5/1988 | Aoai et al. | 430/175 |
| 4,877,711 | 10/1989 | Aoai et al. | 430/176 |
| 4,940,646 | 7/1990 | Pawlowski | 430/175 |
| 4,950,582 | 8/1990 | Aoai et al. | 430/175 |
| 4,983,491 | 1/1991 | Aoai et al. | 430/175 |
| 5,100,957 | 3/1992 | Oshima et al. | 525/61 |
| 5,112,743 | 5/1992 | Kamiya et al. | 430/175 |
| 5,169,897 | 12/1992 | Walls | 525/61 |
| 5,219,699 | 6/1993 | Walls et al. | 430/156 |
| 5,260,161 | 11/1993 | Matsumura et al. | 430/161 |
| 5,330,877 | 7/1994 | Curtis | 430/287.1 |
| 5,616,449 | 4/1997 | Cheng et al. | 430/302 |
| 5,925,491 | 7/1999 | Baumann et al. | 430/175 |

FOREIGN PATENT DOCUMENTS

| | | |
|---|---|---|
| 216083 | 4/1987 | European Pat. Off. . |
| 0709399 | 3/1989 | European Pat. Off. . |
| 0727714 | 5/1990 | European Pat. Off. . |
| 368327 | 5/1990 | European Pat. Off. . |
| 397375 | 11/1990 | European Pat. Off. . |
| 406599 | 1/1991 | European Pat. Off. . |
| 406600 | 1/1991 | European Pat. Off. . |
| 414099 | 2/1991 | European Pat. Off. . |
| 415302 | 3/1991 | European Pat. Off. . |
| 487343 | 5/1992 | European Pat. Off. . |
| 679950 | 11/1995 | European Pat. Off. . |
| 2053363 | 5/1972 | Germany . |
| 2626769 | 1/1977 | Germany . |
| 2838025 | 3/1979 | Germany . |
| 3130987 | 2/1983 | Germany . |
| 3633456 | 4/1987 | Germany . |
| 3701626 | 7/1987 | Germany . |
| 3644162 | 7/1988 | Germany . |
| 3644163 | 7/1988 | Germany . |
| 2751060 | 9/1989 | Germany . |
| 2626769 | 5/1990 | Germany . |
| 3903001 | 8/1990 | Germany . |
| 3633456 | 11/1990 | Germany . |
| 19644515 | 5/1992 | Germany . |
| 4231324 | 4/1993 | Germany . |
| 2349948 | 11/1995 | Germany . |
| WO 8901871 | 3/1989 | WIPO . |

POLYVINYL ACETALS HAVING IMIDO GROUPS AND USE THEREOF IN PHOTOSENSITIVE COMPOSITIONS

FIELD OF THE INVENTION

The present invention relates to binders and photosensitive compositions comprising said binders and, inter alia, excellently suitable for the production of lithographic plates.

BACKGROUND OF INVENTION

Nowadays, photosensitive compositions usable particularly for high-performance lithographic plates must fulfill high requirements.

In order to improve the properties of photosensitive compositions and thus also of the corresponding lithographic plates, essentially two different ways are taken. One of them deals with the improvement of the properties of the photosensitive components in the compositions (frequently negative diazo resins, photo polymers etc.), the other one with the search for novel polymeric compounds ("binders"), which are to control the physical properties of the photosensitive layers. In particular the latter way is decisive for lithographic plates because the behavior in the developing and printing processes (such as developability, ink receptivity, scratch resistance, consistency in the number of prints produced) is decisively influenced by the polymeric binders. Also shelf life and photosensitivity of the materials are strongly influenced by such polymeric compounds.

The polymeric binders, therefore, exhibit various structural elements for satisfying the extensive requirements, which may have different effects on individual properties. For instance, hydrophilic structural elements such as carboxyl groups, hydroxyl groups and the like generally promote the developability of the photosensitive compositions in aqueous alkaline developers and partly ensure sufficient adhesion to polar substrates. Hydrophobic structural elements, on the other hand, reduce the capability of being developed in the above-mentioned developers, but ensure the good ink receptivity used in the printing process, which is indispensable in lithographic plates.

Due to the broad range of requirements regarding the polymeric binders, there have been extensive studies for many years on the synthesis and optimization of the use of these substances for photosensitive compositions, cf. e.g. H. Baumann and H. -J. Timpe: "Chemical Aspects of Offset Printing" in *J. prakt. Chem./Chemiker-Zeitung* [Journal for chemists] 336 (1994) pages 377–389.

EP-A-135 026, EP-A-186 156 and U.S. Pat. No. 4,731, 316 describe binder systems consisting of compositions of polymers having different hydrophilic/hydrophobic properties. However, such compositions have the disadvantage that very frequently incompatibilities between the different substances lead to separation during the formation of layers. Furthermore, it was found that the hydrophobic polymers precipitate during the developing process of the processing of the lithographic plates, which may lead to silting in the developing machines and the redeposition of dispersed layer portions on the surface of the photosensitive material.

Furthermore, various copolymers consisting of only slightly hydrophilic monomers such as styrene, acrylic acid ester, methacrylic acid ester and the like with hydrophilic comonomers were described. Examples of such comonomers are semi-esters of maleic acid (DE-A-31 30 987, EP-B-71 881, EP-A-104 863), itaconic acid (EP-A1-397375, U.S. Pat. No. 5,260,161) and acrylic acid and/or methacrylic acid (EP-A-487 343, U.S. Pat. No. 4,304,832, U.S. Pat. No. 4,123,276). The very tight play of the properties important for their use, which are layer adhesion, developability and printing ink receptivity, proved to be disadvantageous in such polymers. Variations in the polymers' composition can hardly be avoided during the production process, which leads to unacceptable fluctuations in the plates' properties.

DE-A-27 51 060 describes photosensitive compositions, wherein the binder is a reaction product of cellulose esters with cyclic, intermolecularacid anhydrides of dicarboxylic acids. These binders, however, are not oleophilic enough for the use in lithographic plate formulations.

Polymers that contain urethane groups were also described as binders for photosensitive compositions (EP-A2-415 302, EP-A1-406 599, EP-A1-406 600, EP-A2-414 099, U.S. Pat. No. 4,983,491, U.S. Pat. No. 4,950,582, U.S. Pat. No. 4,877,711). These polyurethane resins contain functional groups (—COOH, —SO$_2$NHCOO—, —CONHSO$_2$NH—) with an acidic hydrogen, whose pK$_a$ values in water are no higher than 7. The necessary functionalization with such hydrophilic groups, however, requires very high efforts regarding synthesis and involves high costs.

Another group of binders described are acetals of aliphatic aldehydes having a lower alkyl group and vinyl alcohol/vinyl acetate copolymers (U.S. Pat. No. 2,179,051, EP-B1-216 083). Such binders, however, cause problems in the developing of lithographic plates due to the portion of hydrophilic groups in the polymer being too low. Semiacetalized vinyl alcohol/vinyl acetate copolymers were provided with alkali soluble groups by means of special reactions for improvement (EP-A-48 876, U.S. Pat. No. 4,387, 151, U.S. Pat. No. 3,732,106, DE-A-20 53 363, EP-A-152 819, DE-A-36 44 163, U.S. Pat. No. 4,741,985, EP-A-208 145, DE-A-37 01 626, U.S. Pat. No. 5,169,897, DE-A-36 44 162, U.S. Pat. No. 4,940,646, DE-A-39 03 001 and U.S. Pat. No. 5,219,699). Particularly preferred, carboxyl and sulfonyl urethane groups were introduced into the polymers in order to achieve the desired developability parameters. The introduction of the acidic carboxyl group into the side chain of the polyvinyl acetals may, however, lead to ink receptivity problems, particularly when alkaline wetting agents arc used in the printing process. In the case of sulfonyl urethane containing binders, this disadvantage is almost excluded; however, the production of such binders involves difficulties and high costs. Also in the case of polyvinyl acetals, which have stilbazole units within the molecule (U.S. Pat. No. 5,330,877), a good ink receptivity is practically not achieved.

In addition, all these known systems have the disadvantage of a relatively low photochemical sensitivity, which is why they are rather unsuitable for applications requiring highly sensitive compositions.

It is known that the light-induced cross-linking of imidogroup containing polymers in the presence of certain sensitizers may lead to photosensitive compositions having a higher photochemical sensitivity. However, their use for producing lithographic plates is strongly limited due to an insufficient adhesion on the commonly used aluminum substrates. This particularly leads to a reduced number of prints produced, so that their practical use is complicated greatly. Therefore, especially prepared substrates are necessary (EP-A-377 589), or diazo resins (U.S. Pat. No. 5,112,743, DE-A-3 633 456, EP-A-368 327) and/or certain polymers (EP-A-679 950) must be added. The latter measures, however, lead to a lower sensitivity of such compositions, which in turn leads to longer exposure times.

SUMMARY OF THE INVENTION

It is thus the object of the present invention to provide polymers for photosensitive compositions which, in addition to their high photosensitivity, ensure a good adhesion to normal Al substrates and thus lead to an acceptable number of prints produced without affecting the ink receptivity. It is furthermore the object of the present invention to provide polymers enabling compositions to suffice with as few components as possible vis-a-vis the compositions described in the state of the art when used in photosensitive compositions (which makes them economically desirable) and still having the same or—in individual areas—improved physical properties.

These objects are achieved by means of the imido acetals described in claim 1 containing a maleinimido side-chain. When used in photosensitive compositions, they must be used in combination with sensitizers making a photocyclo addition possible.

In particular, the present invention relates to photosensitive compositions comprising:

(i) a polymeric binder and
(ii) a sensitizer and optionally at least one other component selected from dyes/pigments for increasing the contrast of the image, surfactants, acids as well as plasticizers characterized in that the binder consists of units A, B, C, D, wherein A is present in an amount of 0.5 to 20 wt.-% and is of the formula

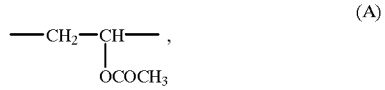

(A)

B is present in an amount of 15 to 35 wt.-% and is of the formula

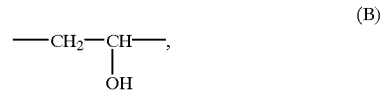

(B)

C is present in an amount of 10 to 50 wt.-% and is of the formula

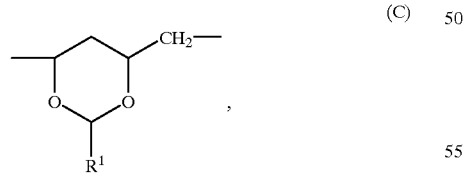

(C)

wherein $R^1$ is an alkyl group with up to 4 carbons, which is optionally substituted by an acid group, or a phenyl group, to which an acid group is attached, wherein the phenyl group optionally comprises 1 to 2 further substituents selected from halos, amino, methoxy, ethoxy, methyl and ethyl groups, or is a group $X-NR^6-CO-Y-COOH$, wherein X is an aliphatic, aromatic or araliphatic spacer group, $R^6$ is hydrogen or an aliphatic, aromatic or araliphatic moiety and Y is a saturated or unsaturated chain- or ring-shaped spacer group, and this unit C may be contained several times with various moieties $R^1$ independent of one another, and D is present in an amount of 25 to 70 wt.-% and is of the formula

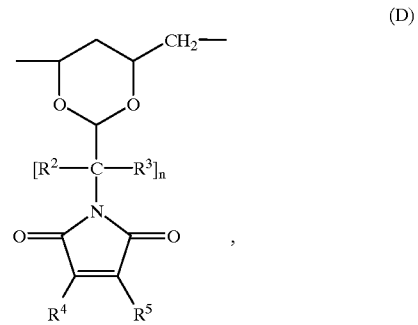

(D)

wherein n is an integer from 1 to 3 and $R^2$ and $R^3$ are a hydrogen or a methyl group, and $R^4$ and $R^5$ independent of one another are alkyl groups having no more than 4 carbons or $R^4$ and $R^5$, together with the two carbons they are attached to, represent a 5- or 6-membered carbocyclic ring.

DETAILED DESCRIPTION OF THE INVENTION

The vinyl alcohol/vinyl acetate copolymers that serve as starting material for the preparation of the polymers of the present invention are 70 to 98 mole % hydrolized and have a weight-average molecular mass $M_w$ of 20,000 to 130,000 g/mole. Suitable copolymers of this type are commercially available. Which copolymer is used as starting material for the synthesis depends on the intended use of the photosensitive composition. If offset lithographic plates are to be produced, polymers with a weight-average molecular mass $M_w$ of 35,000 to 130,000 g/mole and an hydrolysis degree of the vinyl acetate structural unit of 80 to 98 mole % are preferably used.

The preparation of the polymeric binders of the present invention takes place in two synthesis steps. In a first step, monomeric imido acetals are prepared from amino aldehyde acetals and substituted maleic acid anhydrides. In the second step, the acetalization of polyvinyl alcohol with the monomeric imido acetals takes place.

The two steps may be carried out separately or in a one-pot process.

The imido acetals of the general formula (I) prepared in the first step have not been known so far.

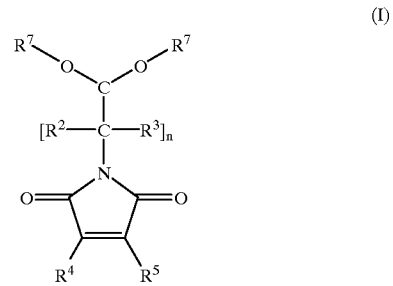

(I)

In formula (I), $R^2$, $R^3$, $R^4$, $R^5$ and n are as defined above and $R^7$ is an alkyl group; preferably $R^7$ is an ethyl group.

These imido acetals can be obtained by reacting amino substituted acetals of aliphatic aldehydes with disubstituted maleic acid anhydrides as well as unsubstituted or substituted tetra hydrophthalic acid anhydrides. Molar amounts of both reaction partners are used.

The reaction takes place under slight heat or reflux in aprotic solvents. Preferred solvents are benzene, toluene, xylene tetrahydrofuran, 1,4-dioxan, 1,3-dioxolane and the like. It is particularly advantageous to remove the water forming during the reaction by means of azeotroping. If the reaction conditions and partners are chosen appropriately, it is possible to isolate the first step of the entire reaction, the semi-amide of the maleic acids and/or tetra hydrophthalic acids. This can then be heated in the solid state or in one of the mentioned solvents to form the imido acetal.

The aliphatic amino substituted acetals necessary for the synthesis and the cyclic acid anhydrides are commercially available products. The moieties $R^2$ and $R^3$ as well as the number n in the amino substituted acetals are as defined above. The maleic acid anhydrides must be substituted in 3 and 4 position for the preparation of the imido acetals to run its course clear-cut and with good yields. If maleic acid anhydride and/or monosubstituted maleic acid anhydrides are used, the yields according to the above described processes are rather low. The majority of the resulting products are resin-like and the separation of the monomeric imido acetals takes great efforts. However, also tetra hydrophthalic acid anhydride or substituted representatives of this anhydride are well suited for the synthesis of these imido acetals.

The reactions between the aliphatic amino substituted acetals and the cyclic acid anhydrides are very straightforward, in most cases quantitative and easy to reproduce. Thus, the imido acetals can be used without any further purification steps for the preparation of the polyvinyl acetals of the present invention. Under certain conditions, it may be advantageous to use the free imino-group containing aldehyde when introducing the imino-group containing acetal moiety of the polyvinyl acetals. The free imino-group containing aldehyde is accessible by means of mild hydrolysis from the above described monomeric imido acetal.

In the second step of the preparation of the imido-group containing polyvinyl acetals of the present invention, vinyl alcohol/vinyl acetate copolymers, the above mentioned imido acetals and aliphatic aldehydes are reacted to form polyvinyl acetals.

The reaction may be carried out according to known standard methods for the synthesis of polyvinyl acetal in the presence of catalytic amounts of a mineral acid; examples are described in EP-B-216 083 and DE-C-2 838 025.

The reaction may either take place in an organic solvent for the vinyl alcohol/vinyl acetate copolymers (cf. brochure Mowiol R-Polyvinyl alcohol, Hoechst A G, 1991, page C13), particularly preferred is dimethyl sulfoxide, or in water in the presence of a surfactant or in a mixture of water and a hydroxyl-group containing solvent, such as ethanol, n-propanol or iso-propanol, particularly preferred is a n-propanol/water mixture. The reaction is usually carried out at temperatures from 50 to 70° C. and with reaction times of 5 to 7 hours. The concentration of the reaction partners based on the amount of solvent is 10 to 18 wt.-%, particularly preferred are 14 wt.-%. The catalytic amount of added mineral acid is between 0.75 and 1.5 wt.-%. This amount of mineral acid must be neutralized upon completion of the reaction by adding molar amounts of an alkaline salt, such as sodium and potassium carbonate in order to prevent an acidically catalyzed deacetalization of the polymeric binders during storage or later use. Sodium and potassium hydroxide are also suitable for the neutralization. The total amount of used aliphatic aldehyde and imido acetal is chosen such that the acetalization degree of the vinyl alcohol/vinyl acetate copolymers is between 40 and 75 wt.-%.

The preferred aliphatic aldehydes for the acetalization of the copolymers are acetaldehyde, propion aldehyde or butyraldehyde. Particularly preferred is propion aldehyde. The amount of aldehyde used based on the imido acetal is from 10 to 90 wt.-%. In general, however, developability and photochemical sensitivity of a photosensitive composition having the polymeric binders of the present invention will decrease as the amount of aliphatic aldehyde increases. It is thus preferred to use 20 to 40 wt.-% aldehyde based on the imido acetal. But also the total acetalization degree, molar mass and degree of hydrolysis of the starting copolymers determine the developability of such compositions.

When preparing the binders of the present invention in organic solvents or hydroxyl-group containing solvent/water mixtures, the end products are precipitated by stirring them into water. The precipitation procedure may also take place such that water is stirred into the reaction mixture. In both cases, the mixture must be intensely mixed in order to obtain a reaction product easy to handle and to separate the side products that also form as quantitatively as possible. In reactions in water, the product will precipitate in the course of the reaction. In both cases, the precipitated reaction product is separated, washed with water and then dried using hot air of 45 to 50° C. until the water content is reduced to no more than 3 wt.-%.

In the imido-group containing polyvinylacetals of the present invention, it is preferred that n in the formula of unit D equals 3 and $R^2$ and $R^3$ each are hydrogen. In another preferred embodiment, the amount of unit D contained in the polyvinylacetal of the present invention is at least 45 wt.-%.

The second substantial component of the photosensitive composition of the present invention is a sensitizer. All sensitizers enabling a photocyclo addition known in the field of the art may be used. Examples are, for instance, the sensitizers mentioned in DE-A-26 26 769 and DE42 31 324, such as xanthone, aceto phenone, benzaldehyde, carbazol, triphenyl amine hexachloro benzene, 4,4-diphenyl cyclohexadienone, 1,2-dibenzoyl benzene, benzophenone, 1,4-diacetyl benzene, fluorene, anthrone, benzanthrone, 2-nitrofluorene, quinoxaline, 4-nitrobiphenyl, 4-cyano benzophenone, thioxanthone (also alkyl or halo substituted), phenyl glyoxal, anthraquinone, quinoline, phenantrene, flavone, Michler's ketone, 4-acetyl diphenyl, 2-acetonaphthene, acridine yellow, 1-naphthyl phenyl ketone, chrysene, 1-acetonaphthol, 1-naphthaldehyde, coronene, benzil, fluorenone, fluorescein (acid), p-nitrostilbene, 5-nitro acenaphthene, 4-nitroaniline, naphthothiazoline, 1-acetylamino-4-nitronaphthalinequinone, benzo thiazoline derivatives, naphtho thiazole derivatives, ketocumarin derivatives, benzothiazole derivatives, naphthofuranone compounds, pyrylium salts and thiapyrylium salts.

Of these, thioxanthone derivatives are particularly preferred.

The weight portion of the sensitizers is preferably 2 to 15 wt.-% based on the photosensitive composition.

The polyvinylacetals of the present invention make it possible to produce offset lithographic plates which can, due to their high photosensitivity (20–50 mJ/cm$^2$), may also be exposed through camera or step-and-repeat systems. In addition, these lithographic plates require neither a cover layer nor is a pre-heat step necessary. The lithographic plates are marked by a good thermal stability, good developability and good resolution as well as good ink receptivity. Furthermore, the photosensitive compositions of this invention have the advantage that they are composed of very few components and are thus more economical.

Suitable dyes and/or pigments for improving the contrast of the image are those that dissolve well in the solvent or solvent mixture used for coating or are easily introduced as a pigment in the disperse form. Suitable contrast dyes and/or pigments include inter alia rhodamin dyes, methyl violet, anthraquinone pigments and phthalocyanine dyes and/or pigments. The dyes and/or pigments may be comprised in the photosensitive composition in an amount of 1 to 15 wt.-%, preferably 2 to 7 wt.-%.

Furthermore, the composition of this invention may comprise acids. These acids include phosphoric, citric, benzoic, 4-toluene sulfonic and tartaric acid. In some formulations, a mixture of several different acids is advantageous. 4-toluene sulfonic acid is preferably used as acid. The added acid preferably amounts to 0.2 to 3 wt.-%.

Furthermore, the photosensitive composition of this invention may comprise more components, such as plasticizers. Suitable plasticizers include dibutyl phthalate, triaryl phosphate and dioctyl phthalate. Dioctyl phthalate is especially preferred. The amount of plasticizer used is preferably 0.25 to 2 wt.-%.

Also negative diazo resins may be present in the photosensitive compositions of the present invention. Their presence, however, is not preferred, since it leads to a reduced photosensitivity, although the photosensitivity is still very good.

The photosensitive compositions of the present invention are preferably usable for producing lithographic plates. In addition, however, they may be used in recording materials for creating images on suitable carriers and receiving sheets, for creating reliefs that may serve as printing molds, screens and the like, as light-hardening varnishes for surface protection and for the formulation of UV-hardening printing inks.

For the preparation of planographic printing plates, aluminum as the carrier is first grained by brushing in a dry state, brushing with abrasive suspensions or electrochemically, e.g. in a hydrochloric acid electrolyte. The grained plates, which were optionally anodically oxidized in sulfuric or phosphoric acid, are then subjected to hydrophilizing aftertreatment, preferably in aqueous solutions of polyvinyl phosphonic acid, sodium silicate or phosphoric acid. The details of the above-mentioned substrate pretreatment are well-known to the person skilled in the art.

The subsequently dried plates are coated with the photosensitive compositions of organic solvents and/or solvent mixtures such that dry layer weights of preferably from 0.5 to 4 g/m$^2$, more preferably from 0.8 to 3 g/m$^2$ are obtained.

In few cases, the additional application of an oxygen-impermeable top layer to the photosensitive layer may be advantageous. The polymers suitable for the top layer include polyvinyl alcohol, polyvinyl alcohol/polyvinyl acetate copolymers, polyvinyl pyrrolidone, polyvinyl pyrrolidone/polyvinyl acetate copolymers and gelatine. The layer weight of the oxygen-impermeable top layer is preferably 0.1 to 4 g/m$^2$, and more preferably 0.3 to 2 g/m$^2$. However, the lithographic plates produced using the photosensitive compositions of the present invention do have excellent properties even with no top layer.

The thus obtained lithographic plates are exposed and developed as known to the person skilled in the art. The developed plates are usually treated with a preservative ("rubber coating"). The preservatives are aqueous solutions of hydrophilic polymers, wetting agents and other additives.

For certain uses it is furthermore advantageous to increase the mechanical strength of the printing layers by means of a heat treatment or a combined use of heat and UV radiation. For this purpose, the plate is first treated with a solution that protects the non-image areas such that the heat treatment will cause no ink receptivity in these areas. A suitable solution is described e.g. in U.S. Pat. No. 4,355,096. However, the lithographic plates produced using the photosensitive compositions of the present invention do have excellent properties even with no heat treatment.

The following examples serve to provide a more detailed explanation of the invention.

EXAMPLE 1

Preparation of 2-(3,4-dimethyl maleinimido) acetaldehyde Dimethyl Acetal

In a three-neck flask, equipped with stirrer, dropping funnel and water separator, protected against the entry of moisture by means of a drying tube, 63 g of 3,4-dimethyl maleic acid anhydride are dissolved in 250 ml of toluene. Subsequently, 54 g of 2-amino acetaldehyde dimethyl acetal are added drop-wise over 30 minutes, with a slight rise in temperature taking place and a precipitate forming. Afterwards, the reaction mixture is refluxed until 9 ml water have precipitated. After the solution is filtered and the toluene is distilled off under slight heating under vacuum, 103 g of product are obtained (yield: 97% based on the acid anhydride used). The IR spectrum comprises only a few peaks. The most intense bands are at 1040, 1070, 1130, 1405, 1705 and 2975 cm$^{-1}$. The product has an acid number of 0.

EXAMPLE 2

Preparation of 3-(3,4-dimethyl maleinimido)propion Aldehyde Diethyl Acetal 86.2 g of 3,4-dimethyl maleic acid anhydride and 100 g of 3-amino propionaldehyde diethyl acetal were processed as described in Preparation Example 1, until 12.2 ml water have precipitated. After further processing, 165 g of product are obtained (yield: 95%). The IR spectrum comprises intense bands at 1060, 1125, 1405, 1440, 1705 and 2985 cm$^{-1}$. The product has an acid number of 0.

EXAMPLE 3

Preparation of 4-(3,4-dimethyl maleinimido) butyraldehyde Diethyl Acetal 78 g of 3,4-dimethyl maleic acid anhydride and 100 g of 4-amino butyraldehyde diethyl acetal were processed as described in Preparation Example 1, until 11.2 ml water have separated. After further processing, 157 g of product are obtained(93%). The IR spectrum comprises intense bands at 1055, 1125, 1405, 1440, 1705 and 2985cm$^{-1}$. The product has an acid number of 0.

EXAMPLE 4

Preparation of 3-(cis-4-cyclohexene-1,2-dicarbonimido)propion Aldehyde Diethyl Acetal 53 g of cis-4-cyclohexene-1,2-dicarboxylic acid anhydride and 50 g of 3-amino propion aldehyde diethyl acetal were processed as described in Preparation Example 1, until 11.2 ml water have precipitated. After further processing, 86 g of product are obtained (95% based on the amino acetal used). The IR spectrum comprises intense bands at 1055, 1125, 1195, 1395, 1700 and 2985 cm$^{-1}$. The product has an acid number of 0.

EXAMPLE 5

Preparation of 4-(3,4-dimethyl maleinimido) butyraldehyde Diethyl Acetal

In a single-neck flask, equipped with reflux condenser, in combination with a drying tube, 30 g of 4-amino butyraldehyde diethyl acetal and 23.4 g of 3,4-dimethyl maleic acid anhydride were dissolved in 150 ml tetrahydrofurane and heated to 65° C. for 6 hours. Subsequently, the solvent and the formed water are distilled off under slight heating under vacuum. The remainder is 44.8 g of product (93% yield), having the same analytical data as that produced according to Preparation Example 3.

EXAMPLE 6

In a three-neck flask, equipped with thermometer, reflux condenser, dropping funnel and magnetic stirrer, 50 g of Mowiol 8/88® (a vinyl alcohol/vinyl acetate copolymer available from Hoechst having a portion of vinyl alcohol units of 79 wt.-% and an $M_w$: 67,000 g/mole) are stirred for 15 hours at 55 to 60° C. in a mixture of 220 g of n-propanol and 140 g of water. Then, 4.5 g of concentrated hydrochloric acid are added. Subsequently, a solution of 2.0 g of acetaldehyde and 49.5 g of maleinimido acetal from Preparation Example 3 in 30 g of n-propanol are added drop-wise within 1 hour at the same temperature and the mixture is stirred for another 4 hours. Then, it is cooled to room temperature and a solution of 8 g of sodium carbonate in 15 ml water is added, causing the pH value of the solution to become 7. Afterwards, the reaction product is precipitated by stirring the mixture into 1.5 l of water, during which intense stirring is necessary. The product is separated, washed intensely using water and dried for two days in the forced-air oven at approx. 45° C. The yield amounts to 92% based on the Mowiol 8/88® used. The obtained product is examined regarding its content of remaining vinyl alcohol units by means of common methods. The resulting content is 21 wt.-%. The introduction of the 3,4-dimethyl maleinimido units leads to intense bands in the IR spectrum at 1410 and 1705 cm$^{-1}$, the vinyl acetate units result in a band at 1730 cm$^{-1}$.

EXAMPLE 7

In a three-neck flask, equipped with thermometer, reflux condenser and magnetic stirrer, 50 g of Mowiol 8/88® are dissolved in 300 g dimethylsulfoxide (DMSO) and this solution is stirred for 14 hours at a temperature of approx. 60° C. Then, 7.5 g of concentrated hydrochloric acid are added, a solution of 51.2 g of the maleinimido acetal from Preparation Example 2 and 4 g of propion aldehyde in 50 g of dimethyl sulfoxide are added drop-wise within 30 minutes and the mixture is stirred for another 12 hours at the indicated temperature. The polymeric binder is precipitated by stirring into 2 l of water, with 8 g of soda dissolved in it, separated by means of vacuuming off and washed well using water. The product is dried as described above (yield: 86% based on the Mowiol 8/88® used, content of vinyl alcohol units: 29 wt.-%, characteristic IR bands at 1410, 1705, 1730 and 2965 cm$^{-1}$).

EXAMPLE 8

The work is performed as in Preparation Example 6 using 50 g of Mowiol 5/88® ($M_w$: 37,000 g/mole), 5 g of propionaldehyde and 53.6 g of maleinimido acetal from Preparation Example 5 (aldehyde and acetal dissolved in 30 ml of n-propanol). The yield amounted to 91 % based on the Mowiol 5/88® used, the content of vinyl alcohol units amounted to 14 wt.-%. The product shows intense bands in the IR spectrum at 1405, 1705, 1730 and 2065 cm$^{-1}$.

EXAMPLE 9

The work is performed as in Preparation Example 6 using 50 g of Mowiol 8/88®, 3.4 g of propion aldehyde and 43.8 g of maleinimido acetal from Preparation Example 3 (aldehyde and acetal dissolved in 30 ml of n-propanol). The yield amounted to 93% based on the Mowiol 8/88® used, the content of vinyl alcohol units amounted to 24 wt.-%. The product shows intense bands in the IR spectrum at 1405, 1705, 1735 and 2970 cm$^{-1}$.

EXAMPLE 10

The work is performed as in Preparation Example 6 using 50 g of Mowiol 5/88®, 6 g of propion aldehyde and 56.4 g of maleinimido acetal from Preparation Example 4 (aldehyde and acetal dissolved in 40 ml of n-propanol). The yield amounted to 89% based on the Mowiol 5/88® used, the content of vinyl alcohol units amounted to 13 wt.-%. The product shows intense bands in the IR spectrum at 1400, 1695, 1730 and 2965 cm$^{-1}$.

EXAMPLE 11

The work is performed as in Preparation Example 6 using 50 g of Mowiol 8/88®, 6 g of propion aldehyde and 53.6 g of maleinimido acetal from Preparation Example 3 (aldehyde and acetal dissolved in 40 ml of n-propanol). The yield amounted to 93% based on the Mowiol 8/88® used, the content of vinyl alcohol units amounted to 13 wt.-%. The product shows intense bands in the IR spectrum at 1405, 1705, 1735 and 2970 cm$^{-1}$.

EXAMPLE 12

4.3 g of 3,4-dimethyl maleic acid anhydride are dissolved in 50 ml of DMSO. 5.4 g of 4-amino butyraldehyde diethyl acetal are added drop-wise under stirring and then the mixture is heated to 70° C. for 4 hours. Subsequently, 15 g of Mowiol 8/88® are dissolved in 80 ml of DMSO at 60° C. and this solution, as well as 1.5 ml of concentrated hydrochloric acid are added to the above mixture. The resulting mixture of the two solutions is then stirred for 4 hours at 60° C. After that, 0.8 g of acetaldehyde and 1.3 g butyraldehyde are added drop-wise and the mixture is stirred for another 4 hours at 60° C. The polymer is precipitated in 400 ml of water, washed thoroughly using water and dried for 24 hours in a forced-air oven at 40° C. The analytical examination of the product results in a content of vinyl alcohol units of 23 wt.-% and IR bands at 1405, 1705, 1730 and 2965 cm$^{-1}$.

EXAMPLE 13

A coating solution is prepared from the following components:
5.35 g of maleinimido polyvinyl acetal according to Example 6
0.3 g of Renol blue B2G-HW® (Hoechst: copper phthalocyanine pigment dispersed in polyvinyl butyral)

0.3 g of Quantacure ITX® (Rahn: isopropyl thioxanthone)

The mentioned components are dissolved under stirring in 100 ml of a mixture consisting of 45 parts by volume methanol
30 parts by volume methyl glycol
25 parts by volume methyl ethyl ketone After filtering the solution, it is applied to an electrochemically grained and anodized aluminum foil that was subjected to an aftertreatment using polyvinyl phosphonic acid by means of common methods and the coating is dried for 4 minutes at 90° C. The dry weight of the printing layer amounts to approx. 1 g/m².

The printing layer is exposed under a silver film halftone step wedge having a tonal range of 0.15 to 1.95, wherein the density increments amount to 0.15, to give a negative model using a metal halogenide lamp (MH burner, available from W. Sack) of 300 mJ/cm².

The exposed coating is treated for 30 seconds with a developer solution comprising 3.4 parts by weight Rewopol NLS 28® (30% solution of sodium lauryl sulfate in water available from Rewo)
1.8 parts by weight 2-phenoxy ethanol
1.1 parts by weight diethanol amine
1.0 parts by weight Texapon 842® (42% solution of octylsulfate in water available from Henkel)
0.6 parts by weight Nekal BX Paste® (sodium salt of an alkyl naphthaline sulfonic acid available from BASF)
0.2 parts by weight 4-toluene sulfonic acid
91.9 parts by weight water.

Then the developer solution is again rubbed over the surface for another 30 seconds using a tampon and then the entire plate is rinsed with water. After this treatment the exposed portions remain on the plate. For the assessment of its photosensitivity and ink receptivity, the plate is blackened in a wet state using a printing ink. The products 304® (Kodak Polychrome Graphics) and RC43® (Hoechst) were used.

The plate's ink receptivity is good with both inks and exposed microscopic lines are very well reproduced. The gray wedge is completely covered up to step 3 and partially covered up to step 9.

For the preparation of a lithographic plate, a printing layer is applied to the aluminum foil, as explained above, exposed, developed and after rinsing with water, the developed plate is wiped and rubbed with an aqueous solution of 0.5% phosphoric acid and 6% gum arabic. The thus prepared plate is loaded in a sheet-fed offset printing machine and under normal printing conditions provides 35,000 copies of good quality.

EXAMPLE 14

Example 1 is repeated; however, instead of the maleinimido polyvinyl acetal according to Preparation Example 6, the one according to Preparation Example 8 is used. Upon exposure with 30 mJ/cm² and blackening, the resulting printing layer exhibits a solid step of 3 and the steps up to 9 are partially covered. There are no ink receptivity problems with either ink. In the sheet-fed offset printing machine, one lithographic plate provided 40,000 copies of good quality.

EXAMPLE 15

The test of Example 1 is modified as follows: instead of the maleinimido polyvinyl acetal according to Preparation Example 6, the one according to Preparation Example 11 is used, and instead of Quantacure ITX®, Quantacure CPTX® (Rahn: 1-chloro-4-propoxy thioxanthone). The parts by weight of the components of the coating solution and its further processing remain unchanged.

Upon blackening, the printing layers according to the present invention exhibit a solid step of 2 and the steps up to 8 are partially covered. The blackening takes place with both inks evenly. In the sheet-fed offset printing machine, one lithographic plate provided 35,000 copies of good quality.

EXAMPLE 16

Example 1 is repeated; however, instead of the maleinimido polyvinyl acetal according to Preparation Example 6, the one according to Preparation Example 9 is used. Upon blackening, the resulting printing layer exhibits a solid step of 3 and the steps up to 9 are partially covered. There are no ink receptivity problems with either ink. In the sheet-fed offset printing machine, one lithographic plate provided 40,000 copies of good quality.

EXAMPLE 17

A coating solution is prepared from the following components:

5.25 g of maleinimido polyvinyl acetal according to Preparation Example 7
0.3 g of Renol blue B2G-HW® (Hoechst: copper phthalocyanine pigment dispersed in polyvinyl butyral)
0.3 g of Quantacure CPTX® (Rahn: 1-chloro-4-propoxy thioxanthone)
0.1 g of 4-toluene sulfonic acid The mentioned components are dissolved in the solvent mixture according to Example 1 and further processed as described there. The dry weight of the printing layer amounts to approx. 1 g/m².

The printing layer is exposed, developed and blackened as described in Example 1. Upon blackening, the printing layer exhibits a solid step of 4 and the steps up to 9 are partially covered. In the sheet-fed offset printing machine, one lithographic plate provided 50,000 copies of good quality.

EXAMPLE 18

A coating solution according to Example 1 is prepared, wherein instead of the maleinimido polyvinyl acetal according to Preparation Example 6, the one according to Preparation Example 12 is used. The coating solution is applied to an electrochemically grained and anodized aluminum foil that, after anodization, was dipped into a 2.5 wt.-% aqueous sodium silicate solution for 1 minute at 70° C., washed using water and dried.

The further processing takes place as describe in Example 1.

The printing layer is exposed, developed and blackened as described in Example 1. There are no ink receptivity problems whatsoever. Upon blackening, the resulting printing layer exhibits a solid step of 3 and the steps up to 8 are partially covered. In the sheet-fed offset printing machine, one lithographic plate provided 35,000 copies of good quality.

EXAMPLE 19

Comparative Example

A coating solution is prepared from the following components:

5.25 g of copolymer of methyl methacrylate/N-[2-(methacryloyloxy)ethyl]-2,3-dimethyl maleinimide/methacrylic acid (weight ratio: 15/65/20)

0.3 g of Renol blue B2G-HW® (Hoechst: copper phthalocyanine pigment dispersed in polyvinyl butyral)

0.3 g of Quantacure ITX® (Rahn: isopropyl thioxanthone)

The mentioned components are dissolved in the solvent mixture according to Example 1 and further processed as described there. The weight of the printing layer amounts to approx. 1 g/m².

The printing layer is exposed, developed and blackened as described in Example 1. Upon blackening, the printing layer exhibits a solid step of 2 and the steps up to 7 are partially covered. In the sheet-fed offset printing machine, one lithographic plate provided only 5,000 copies of good quality.

We claim:

1. A polyvinyl acetal containing the units A, B, C and D, wherein A is present in an amount of 0.5 to 20 wt.-% and is of the formula

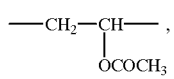
(A)

B is present in an amount of 15 to 35 wt.-% and is of the formula

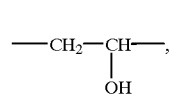
(B)

C is present in an amount of 10 to 50 wt.-% and is of the formula

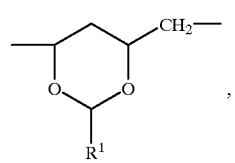
(C)

wherein $R^1$ is an alkyl group with up to 4 carbons, which is optionally substituted by an acid group, or a phenyl group, to which an acid group is attached, wherein the phenyl group optionally comprises 1 to 2 further substituents selected from halos, amino, methoxy, ethoxy, methyl and ethyl groups, or is a group X—NR⁶—CO—Y—COOH, wherein X is an aliphatic, aromatic or araliphatic spacer group, $R^6$ is hydrogen or an aliphatic, aromatic or araliphatic moiety and Y is a saturated or unsaturated chain- or ring-shaped spacer group, and this unit C may be contained several times with various moieties $R^1$ independent of one another, and D is present in an amount of 25 to 70 wt.-% and is of the formula

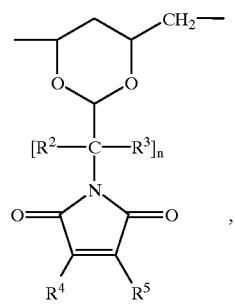
(D)

wherein n is an integer from 1 to 3 and $R^2$ and $R^3$ are a hydrogen or a methyl group, and $R^4$ and $R^5$ independent of one another are alkyl groups having no more than 4 carbons or $R^4$ and $R^5$, together with the two carbons they are attached to, represent a 5- or 6-membered carbocyclic ring.

2. The polyvinyl acetal of claim 1, wherein $R^4$ and $R^5$ each are a methyl group.

3. The polyvinyl acetal of claim 1, wherein n is 3 and $R^2$ and $R^3$ each are a hydrogen.

4. The polyvinyl acetal of claim 1, wherein unit D is present in an amount of at least 45 wt.-%.

5. The polyvinyl acetal of claim 1, wherein $R^1$ is an ethyl group.

6. The polyvinyl acetal of claim 1, wherein weight-average molecular weight $M_w$ is within the range of from 20,000 to 130,000 g/mole.

7. A photosensitive composition, containing:
   (i) a polyvinyl acetal of claim 1 as a binder and
   (ii) a sensitizer for photocyclo addition.

8. The composition according to claim 7, wherein $R^4$ and $R^5$ each are a methyl group.

9. The composition according to claim 7, wherein n is 3 and $R^2$ and $R^3$ each are a hydrogen.

10. The composition of claim 7 wherein unit D is present in an amount of at least 45 wt.-% of the polyvinyl acetal.

11. The composition of claim 7 wherein each $R^1$ is an ethyl group.

12. The composition of claim 7 wherein weight-average molecular weight $M_w$ of the polyvinyl acetal is within the range of from 20,000 to 130,000 g/mole.

13. The composition according to claim 7, additionally containing at least one other component selected from dyes/pigments for increasing the contrast of the image, surfactants, acids as well as plasticizers.

14. The composition according to claim 7, wherein the sensitizer is a thioxanthane derivative.

15. The composition according to claim 13, wherein a dye or pigment for increasing the contrast of the image is present as additional component.

16. A method of producing a lithographic plate comprising coating a pretreated printing plate with the photosensitive composition of claim 7.

* * * * *

UNITED STATES PATENT AND TRADEMARK OFFICE
CERTIFICATE OF CORRECTION

PATENT NO. : 6,087,066
DATED : July 11, 2000
INVENTOR(S) : Baumann, et. al.

It is certified that error appears in the above-identified patent and that said Letters Patent is hereby corrected as shown below:

Column 2, line 11: "intermolecularacid" should read -- intermolecular acid --
Column 9, line 15: "tetrahydrofurane" should read -- tetrahydrofuran --

Signed and Sealed this

Twenty-second Day of May, 2001

Attest:

NICHOLAS P. GODICI

Attesting Officer

Acting Director of the United States Patent and Trademark Office